United States Patent
Becker

(10) Patent No.: US 11,130,363 B2
(45) Date of Patent: Sep. 28, 2021

(54) FULL GRAPHICS IN-MOLD LABEL AND APPLICATIONS THEREOF

(71) Applicant: ImageWorks Interactive, Park Forest, IL (US)

(72) Inventor: Thomas W. Becker, Willow Springs, IL (US)

(73) Assignee: ImageWorks Interactive, Park Forest, IL (US)

( * ) Notice: Subject to any disclaimer, the term of this patent is extended or adjusted under 35 U.S.C. 154(b) by 0 days.

(21) Appl. No.: 14/109,288

(22) Filed: Dec. 17, 2013

(65) Prior Publication Data

US 2014/0170347 A1 Jun. 19, 2014

Related U.S. Application Data

(60) Provisional application No. 61/738,690, filed on Dec. 18, 2012.

(51) Int. Cl.
| | | |
|---|---|---|
| *B44C 1/16* | (2006.01) | |
| *B44C 1/17* | (2006.01) | |
| *H05K 1/18* | (2006.01) | |
| *B29D 22/00* | (2006.01) | |
| *B32B 27/34* | (2006.01) | |

(Continued)

(52) U.S. Cl.
CPC .............. *B44C 1/16* (2013.01); *B44C 1/1729* (2013.01); *B29D 22/00* (2013.01); *B29D 23/00* (2013.01); *B32B 27/08* (2013.01); *B32B 27/34* (2013.01); *H05K 1/182* (2013.01); *Y10T 428/1352* (2015.01); *Y10T 428/24802* (2015.01); *Y10T 428/24843* (2015.01)

(58) Field of Classification Search
CPC .......... B29D 22/00; B29D 23/00; B32B 1/08; B32B 27/08; B32B 27/34
See application file for complete search history.

(56) References Cited

U.S. PATENT DOCUMENTS 3,922,435 A 11/1975 Asnes
5,205,444 A * 4/1993 Polhemus .............. A47G 19/12
 222/472

(Continued)

FOREIGN PATENT DOCUMENTS

WO 2011037732 A2 3/2011

OTHER PUBLICATIONS

Maul et al., Ullmann's Encyclopedia of Industrial Chemistry, 2012, vol. 29. Polystyrene and Styrene Copolymers. Wiley Online Library, p. 487.*

(Continued)

*Primary Examiner* — Anthony J Frost
(74) *Attorney, Agent, or Firm* — Garlick & Markison; Timothy W. Markison

(57) ABSTRACT

An in-mold label includes a substrate having a first surface and a second surface. When the in-mold label is molded on to, or into, a plastic product, the first surface faces outward with respect to the plastic product and the second surfaces faces inward with respect to the plastic product. The substrate includes a full graphics area on the second surface. Ink is applied in the full graphics area to provide a full graphics image. To facilitate the molding process, each of the substrate and the ink having a complementary property to a property of the plastic product.

14 Claims, 16 Drawing Sheets

(51) Int. Cl.
    *B32B 27/08*      (2006.01)
    *B29D 23/00*      (2006.01)

(56) References Cited

U.S. PATENT DOCUMENTS

| | | | |
|---|---|---|---|
| 6,726,969 B1* | 4/2004 | Balaji et al. | 428/35.7 |
| 7,097,796 B2 | 8/2006 | Williams et al. | |
| 7,629,400 B2 | 12/2009 | Hyman | |
| 7,910,204 B2 | 3/2011 | Hartman et al. | |
| 2007/0218227 A1* | 9/2007 | Nishizawa et al. | 428/35.7 |
| 2009/0001177 A1* | 1/2009 | Smith | G06Q 20/28 235/494 |
| 2010/0052215 A1* | 3/2010 | Emond | B29C 45/14065 264/275 |
| 2010/0192388 A1 | 8/2010 | Mithal et al. | |
| 2011/0223362 A1 | 9/2011 | Van Loon et al. | |

OTHER PUBLICATIONS

International Searching Authority; International Search Report and Written Opinion; International Application No. PCT/US13/075791; dated Apr. 21, 2014; 11 pgs.

* cited by examiner

FULL GRAPHICS IN-MOLD LABEL AND APPLICATIONS THEREOF

CROSS REFERENCE TO RELATED PATENTS

This patent application is claiming priority under 35 USC § 119(e) to a provisionally filed patent application entitled FULL GRAPHICS IN-MOLD LABEL AND APPLICATIONS THEREOF having a provisional filing date of Dec. 18, 2012 and a provisional Ser. No. of 61/738, 690, which is incorporated by reference herein.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

Technical Field of the Invention

This invention relates generally to molded products and more particularly to a full graphics in-mold labels.

Description of Related Art

In-mold labeling involves the application of decorative labels during the molding process of plastic products. Combining the decoration and manufacturing of plastic products provides greater label durability compared to that of a post mold label when done properly. For proper adhesion, the in-mold label, which includes a substrate, ink, and sometimes a coating, must contain similar properties to that of the plastic product. For example, plastic cups are typically produced using polypropylene (PP), polyethylene (PE), polystyrene (PS), and polycarbonate (PC) and, accordingly, the in-mold label should have similar properties. As a specific example, stadium cups are currently fabricated using PP, but have very limited labeling options.

Styrene acrylonitrile, or SANS, is a styrene acrylic blend that produces a more durable plastic cup. Currently, however, SANS cups have not been commercially decorated other than via post molding decorating using silk screening, heat transfer, or hot stamping.

There are several issues associated with the in-mold labeling process for plastic products including PP and SANS cups. For example, a mismatch in the properties of the ink, substrate, coating, or plastic product or improper molding techniques can cause label deformation, ink blow out (e.g., breakdown of ink, discoloration, and/or ink brittleness), blowing through the label, movement of the label, knit lines, label separation, and/or print distortion. As another example, if the ink has a different temperature range than that of the product, substrate, or coating, ink blow out can occur. As yet another example, movement or miss-registration of the label can occur when resin flows at a non-ideal rate during molding. As a further example, knit lines can occur where two flows come together within the label. As a still further example, label separation and/or print distortion can occur when the resin contains a different shrink and/or expansion rate than those of the substrates, inks, and/or coatings of the label. Another issue is cutting the in-mold labels, which can create debris from printing powder, ink, and/or "hairs". These remnants need to be removed from the parts or will adversely affect the quality and appearance of the in-mold label and overall product.

BRIEF DESCRIPTION OF THE SEVERAL VIEWS OF THE DRAWING(S)

DETAILED DESCRIPTION OF THE INVENTION

Figure 1:
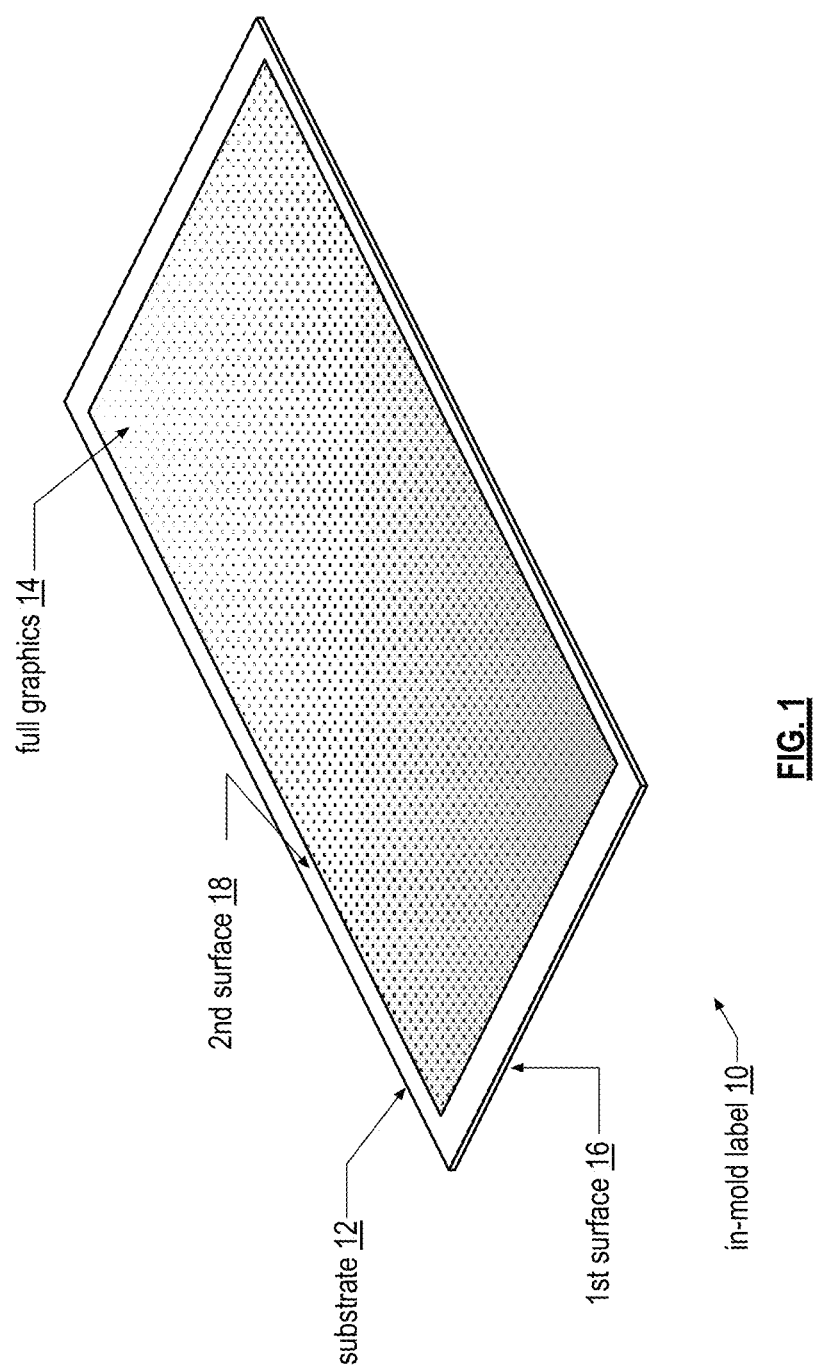
FIG. 1 is an isometric diagram of an embodiment of an in-mold label in accordance with the present invention.

FIG. 1 is an isometric diagram of an embodiment of an in-mold label 10 that includes a substrate 12 and a full graphics area 14. The substrate 12 includes a first surface 16 and a second surface 18. When the in-mold label 10 is adhered to, or molded into a product, the first surface 16 is on the outside of, or faces away from, the product and the second surface 18 is on the inside, or faces the product. The product may be molded from plastic and have any shape or utility such as cups, jars, plates, trays, novelty items, office supplies, etc. The plastic may be polycarbonate (PC), polypropylene (PP), high-density polyethylene (HDPE), low-density polyethylene (LDPE), polyethylene terephthalate (PET), high-impact polystyrene (HIPS), polystyrene (PS), Acrylic, styrene acrylonitrile (SANS), etc. The substrate 12 is made of a material that has complementary properties (e.g., temperature, chemical composition, flexibility, durability, etc.) as the product. For example, if the product is molded from SANS, then the substrate 12 is made of styrene, SANS, a styrene mix, or combination thereof.

Figure 2:
FIGS. 2-4 are examples of in-mold labels having full color graphics in accordance with the present invention.
Figure 2:
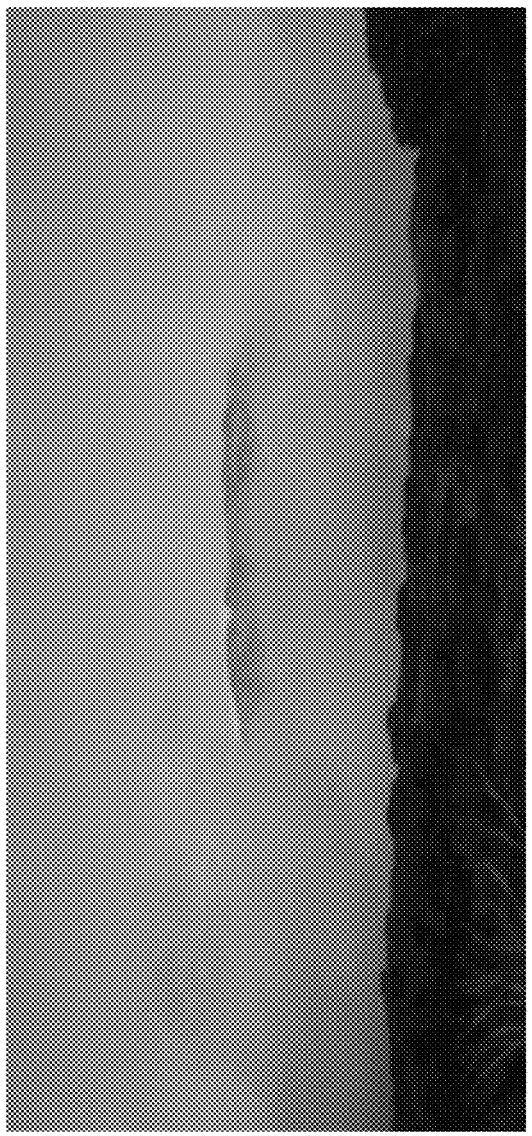
Figure 3:
Figure 4:
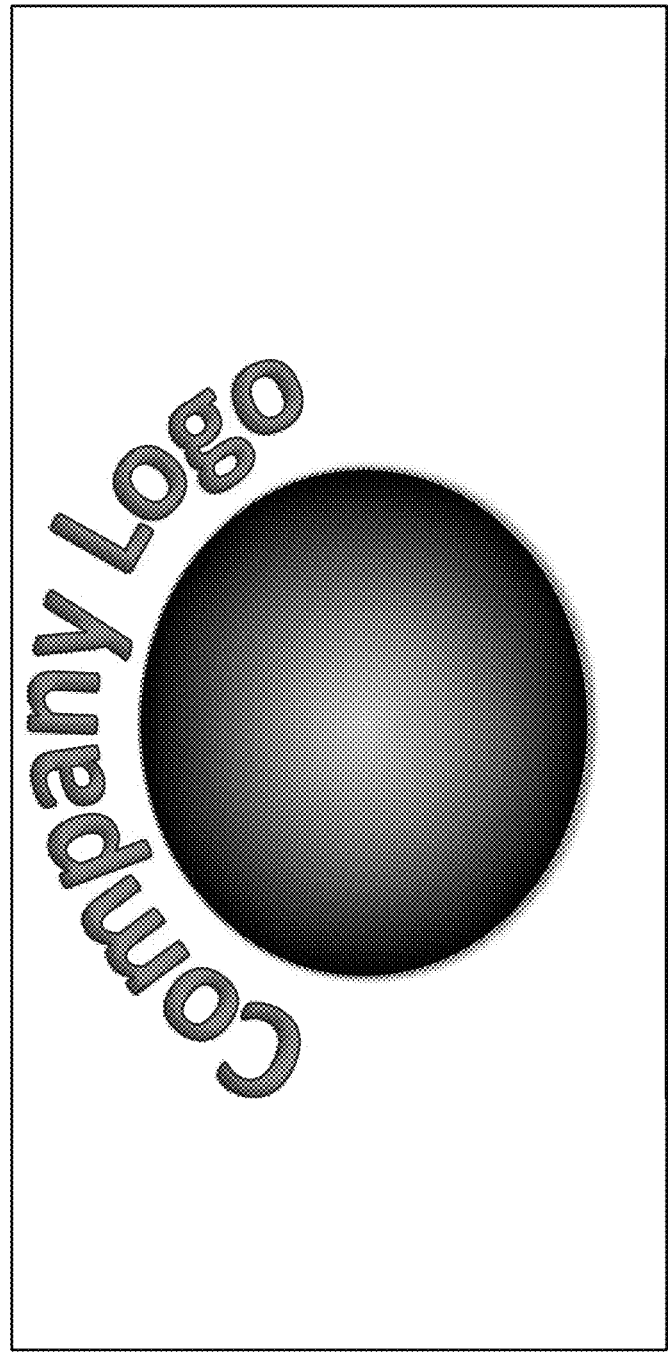

The full graphics area 14 is printed on the second surface 18 using ink that has properties corresponding to the material of the substrate 12. For example, the ink has a temperature range and composition that causes the ink to cure and essentially turn into a plastic during the molding and/or adhering process. The full graphics area 14 may use full color printing to print a metallic looking surface, a scene, a person, an animal, a place, a company logo, etc. on a product. FIGS. 2-4 illustrate examples of full color, or single color, graphics that can be printed in the full graphics area. In particular, FIG. 2 illustrates scenes; FIG. 3 illustrates animals; and FIG. 4 illustrates a company logo.

Returning to the discussion of FIG. 1, once the graphics have been printed into the full graphics area 14, which encompasses some to all of the second surface 18, the full graphics area 14 may be coated, and/or covered with a heat activated adhesive, or adhesives, which aids in the bonding of the in-mold label 10 to the molten resin (e.g., plastic) of the product. Note that the printing may be done in a variety of ways. For example, the printing may be done using one or more of silk-screening, offset lithography, flexographic, gravure, digital, heat transfer or web offset using UV, and conventional inks/coatings.

In mass production, the in-mold labels 10 are made in sheets, or rolls, where the graphics are printed thereon, a coating and/or adhesive is applied (if desired or needed) and the sheets, or rolls, are cut into individual in-mold labels 10. A stack cutter cuts a stack of sheets or rolls to yield the individual in-mold labels 10. For example, the stack cutter cuts a stack having a thickness of 1 to 2 inches, where the thickness of a sheet or roll is 0.001 inch to 0.010 inch, and the stack provides backpressure. To further assist in the cutting, a counter pressure may be used. In comparison to a platen die cutter, the stack cutter substantially reduces debris build up in the molding tools. Alternatively, the in-mold labels 10 may be individually printed on final cut pieces of the substrate.

The printing in the full graphics area 14 may further use, or use in the alternative, a thermochromatic ink, which changes colors with temperature. Further, printing of some of the graphics, or complementary graphics, may be printed on the first surface 16. For example, printing on both surfaces is done to provide a duplicate printing of the graphics. As another example, printing on both surfaces is done to provide a three-dimensional effect. As another example, printing on both surfaces is done to enhance a holographic image. There are certain advantages and disadvantages of printing on each of the surfaces.

For instance, by printing on the first surface 16, the ink faces against the molding tool and the substrate 12 is coming in contact with the molten resin. This is a favorable situation for permanent adhesion to the product, but leaves the ink on the outside of the product subject to the elements. The ink may be protected from scratches, temperature, and/or chemicals with one or more coatings covering the ink. If the in-mold labels 10 are in stacks before entering the molding tool, the ink and/or coating need to be static free to allow robotics to individually place a label in the molding tool. Once a label is in the molding tool, however, the ink and/or coating need to hold a static charge, which may be introduced by a static charger. As such, the labels should be static free when stacked, and statically charged when they individually enter the molding tool, which can be accomplished using a styrene, or the like, substrate. The molding tool may fabricate the finished product using one or more of injection molding, blow molding, and/or rotational molding. The label is held in a desired position for the molding tool using one or more of a static charge, a vacuum, mechanical clamping, a pressure fit for a preformed label.

With printing on the second surface 18, the ink faces away from the molding tool and is in contact with the molten resin of the product being molded. In addition, the raw plastic side of the substrate 12 is facing the molding tool and can readily hold a static charge. With the ink on the inside, it is protected from the elements in the finished product. However, the ink, adhesive, and/or coating need to bond to the molten resin without blowing out or otherwise breaking down. By using inks, adhesives, and/or coatings that have complementary properties (e.g., temperature, chemical composition, flexibility, durability, etc.) as the product, the in-mold label 10 will be sufficiently bonded in the final product.

As another example, the product is a SANS cup or jar with a full graphics in-mold label 10. In this example, the in-mold label 10 uses a thin substrate 12 of styrene (e.g., in the range of 0.001 inches to 0.010 inches). A full color graphics 14 is printed on the second surface 18, which may be coated with a coating and/or adhesive. The inks used for the full color graphics 14 are commercially available inks and have complimentary properties to the SANS cup or jar to enable sufficient bonding without blowing out or other adverse effects. Note that SANS is a blend of acrylic and styrene, where a blend of 70% of styrene and 30% provides sufficiently close properties to that of the styrene substrate 12 to allow sufficient bonding. Further note that the commercially available inks have a temperature range of 300-600 degrees, which is in line with the molding temperatures of the SANS cup or jar. As such, full color graphics is implemented on the second surface 18 of an in-mold label 10 for a SANS product.

Figure 5:
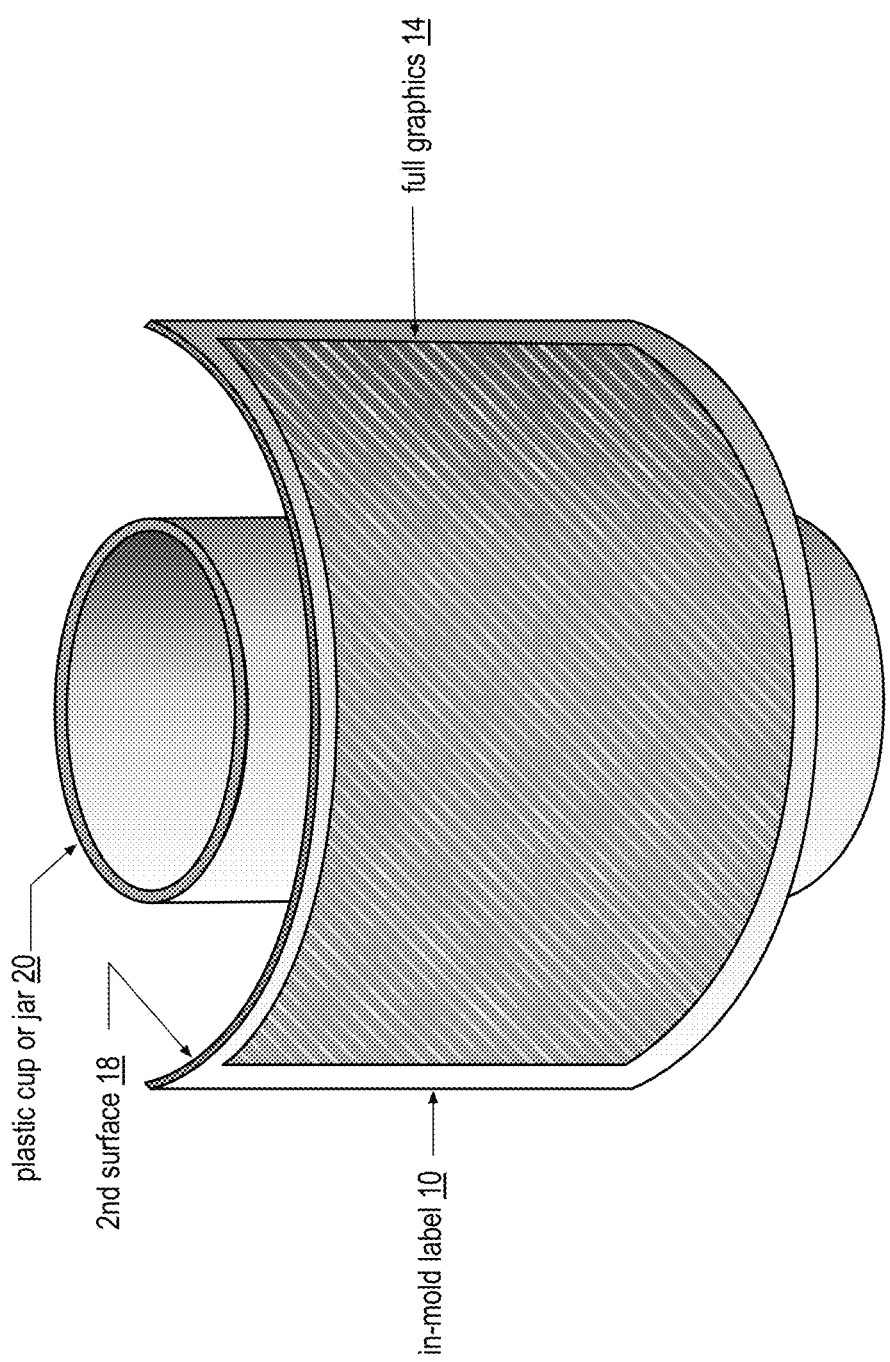
FIG. 5 is an isometric diagram of an embodiment of an in-mold label in relation to a molded plastic cup or jar in accordance with the present invention.

FIG. 5 is an isometric diagram of an embodiment of an in-mold label 10 in relation to a molded plastic cup or jar 20 during a fabrication process. The in-mold label 10 includes a full graphics area 14 wherein a full color graphics is printed on the second surface 18 (and may include complimentary printing on the first surface). The in-mold label 10 may cover substantially all of the outer surface of the plastic cup or jar 20 or cover a portion of the outer surface of the cup or jar 20.

In an example, the in-mold label 10 is bonded to the plastic cup or jar 20 by heating both such that the cup, at least its outer surface, becomes a molten resin. At this point, the in-mold label 10 is pressed into the outer surface of the cup or jar 20. The in-mold label 10 is held in place for a specified duration of time (e.g., a few seconds to tens of seconds) until the label 10 has sufficiently melded to the cup or jar 20. Once this occurs, the cup or jar 20 is cooled.

Figure 6:
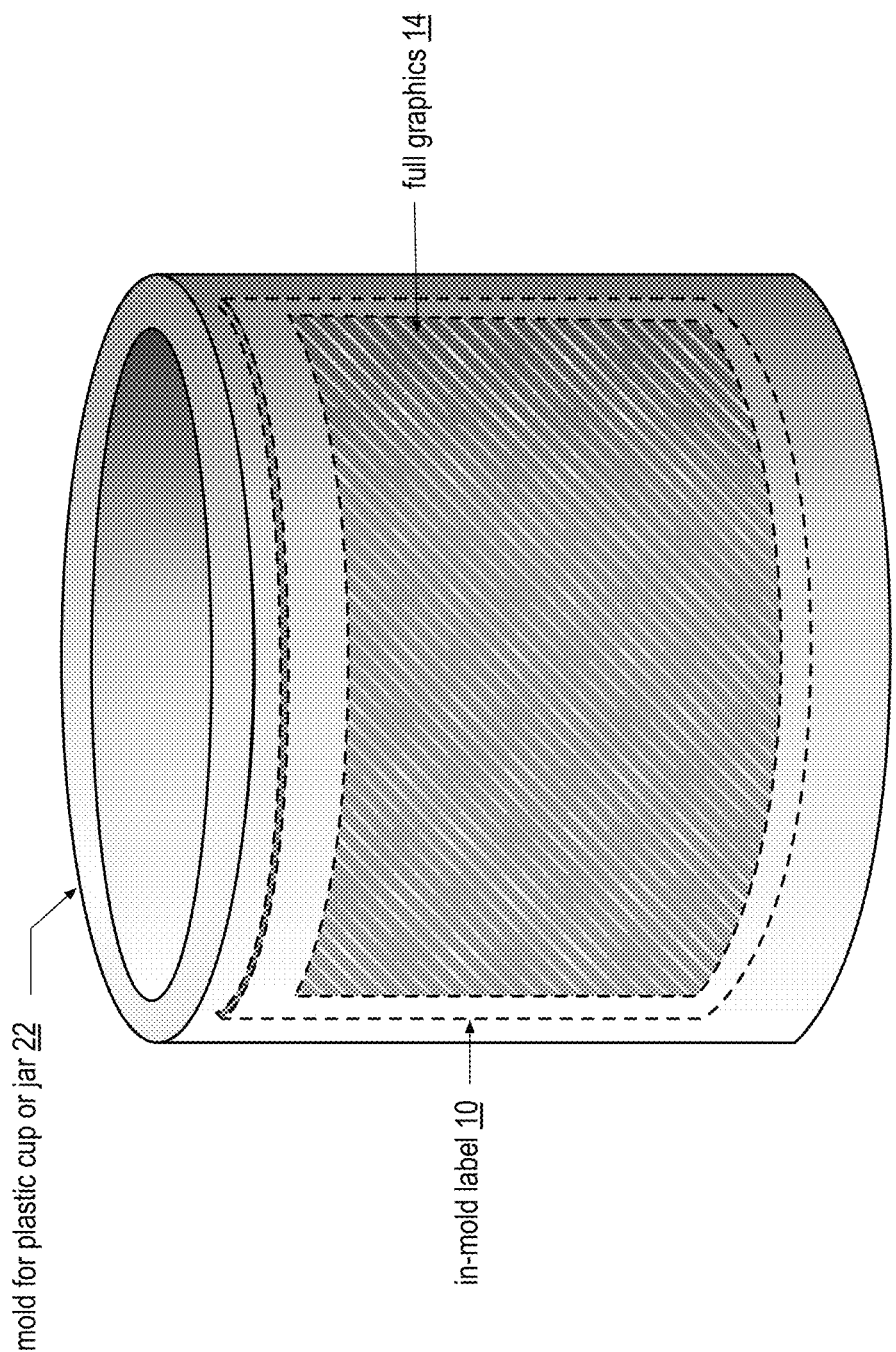
FIG. 6 is an isometric diagram of another embodiment of an in-mold label in a molded plastic cup or jar in accordance with the present invention.

FIG. 6 is an isometric diagram of another embodiment of an in-mold label 10 in a molded plastic cup or jar 22 during a fabrication process. The in-mold label 10 includes a full graphics area 14 wherein a full color graphics is printed on the second surface (and may include complimentary printing on the first surface). The in-mold label 10 may cover substantially all of the outer surface of the plastic cup or jar 22 or cover a portion of the outer surface of the cup or jar 22.

In an example, the in-mold label 10 is bonded to the cup or jar during the molding process of the cup or jar. The process begins with the labels stacked in a magazine, where a label is separated out using deionized air, brushes, and/or vibration and picked up using suction cups or directly on a mandrel. Robotics passes the individual label through a static charger and then presses the label 10 into a mold 22 using mechanical stops in the press. The label is held in place via the static charge and may be further held in place by creating a vacuum in the mold. The vacuum ports can be large or small and leave little to no marks in the finished product.

With the label 10 held in place, the resin is injected into the mold 22. The resin is at a temperature (e.g., approximately 300 degrees for a SANS) product, which melds with the ink and substrate of the in-mold label 10. The melding process may take about 20 seconds and then the molded product is cooled to produce the finished product.

Figure 7:
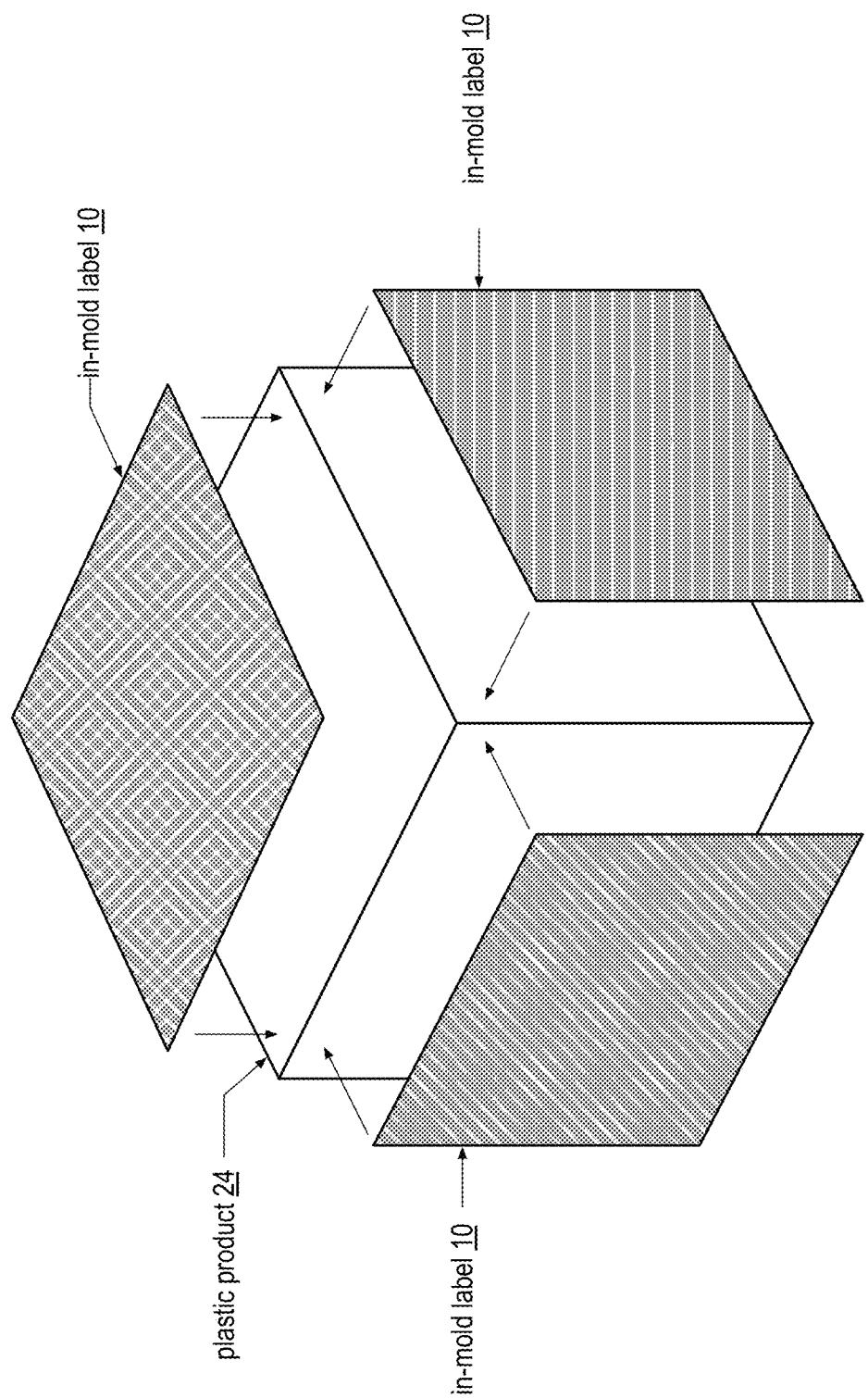
FIG. 7 is an isometric diagram of another embodiment of an in-mold label in a molded plastic product in accordance with the present invention.

FIG. 7 is an isometric diagram of another embodiment of an in-mold label 10 in a molded plastic product 24. The finished plastic product 24 may have any three-dimensional shape, such as a cube, a pyramid, a cone, polyhedrons, etc. Each of the various sides or surfaces of the product may include an in-mold label 10. From side-to-side or surface-to-surface, the in-mold label 10 may include the same graphics, different graphics, or a combination thereof.

Figure 8:
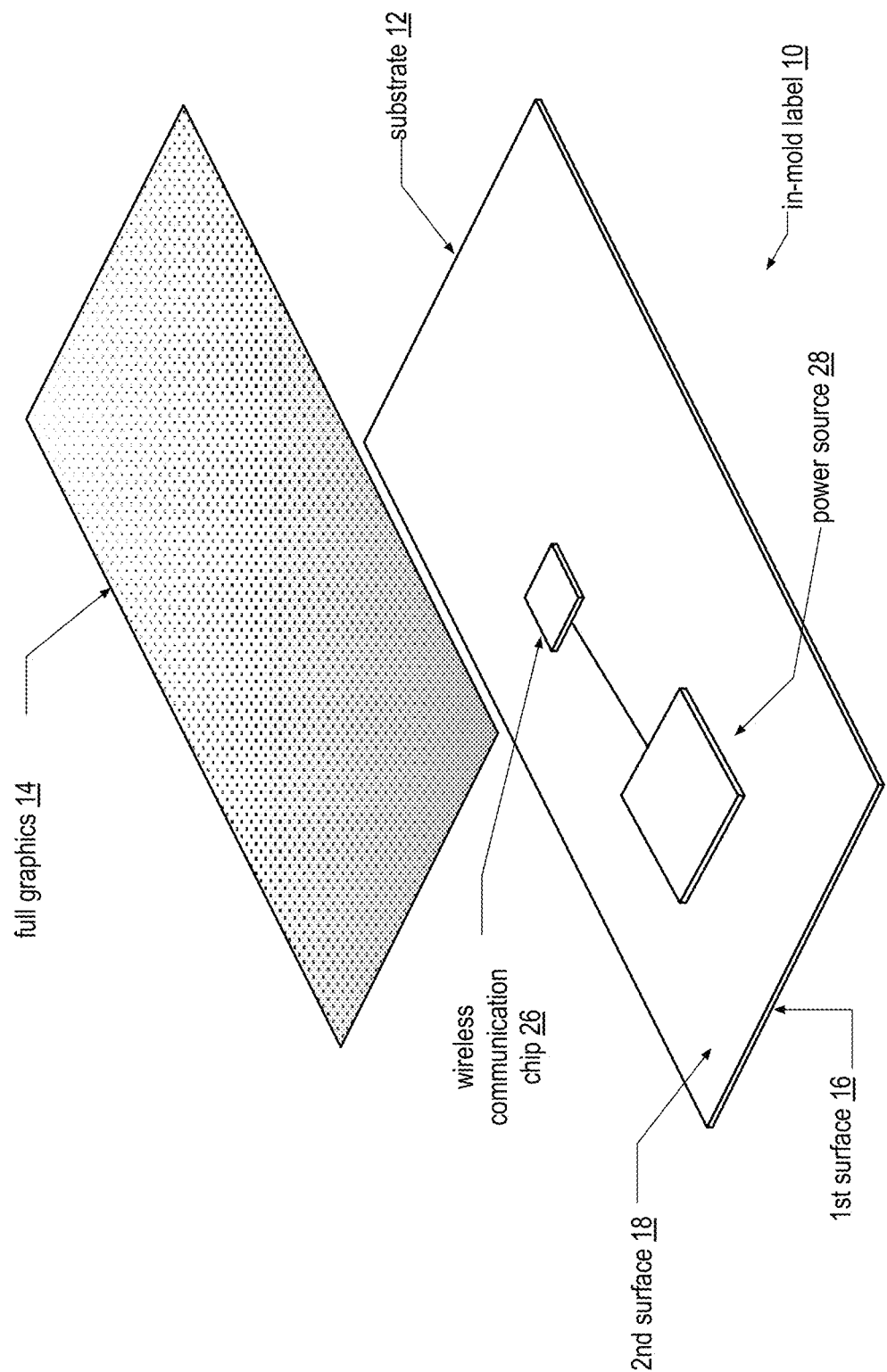
FIG. 8 is an isometric diagram of an embodiment of an in-mold label including a wireless communication chip in accordance with the present invention.

FIG. 8 is an isometric and exploded view diagram of an embodiment of an in-mold label 10 that includes the substrate 12, the full graphics area 14, a wireless communication chip 26, and a power source 28. The wireless communication chip 26 may include circuitry to support RFID (radio frequency Identification), NFC (near field communication), QR code (quick response), BT (Bluetooth), WLAN (wireless local area network), memory, and/or processing module. The power source 28 may be a battery, solar panel, battery with a power supply, etc. The wireless communication chip 26 and the power source 28 are placed on the second surface 18 underneath the full graphics area 14, preferably in an opaque section of the graphics to substantially hide the chip from sight of the user of the product. Nevertheless, the chip may be placed anywhere on the second surface 18 such that it is protected from dishwashing, scratching, chemicals, UV lighting, handling, and/or general abuse of the finished product.

The label with the wireless communication chip 26 may be attached or molded into a finished product as discussed above. As such, the wireless communication chip 26 has properties (e.g., temperature tolerances, expansion & contraction, etc.) comparable to the substrate 12 so it can be molded into and/or adhered to the finished product without compromising its performance. To facilitate the molding and/or adhering process, the outside of the mold (with the label in place) may be cooled as it is waiting for the resin to be injected, blown, or rotated and then cooled quickly once the resin has been injected.

Figure 9:
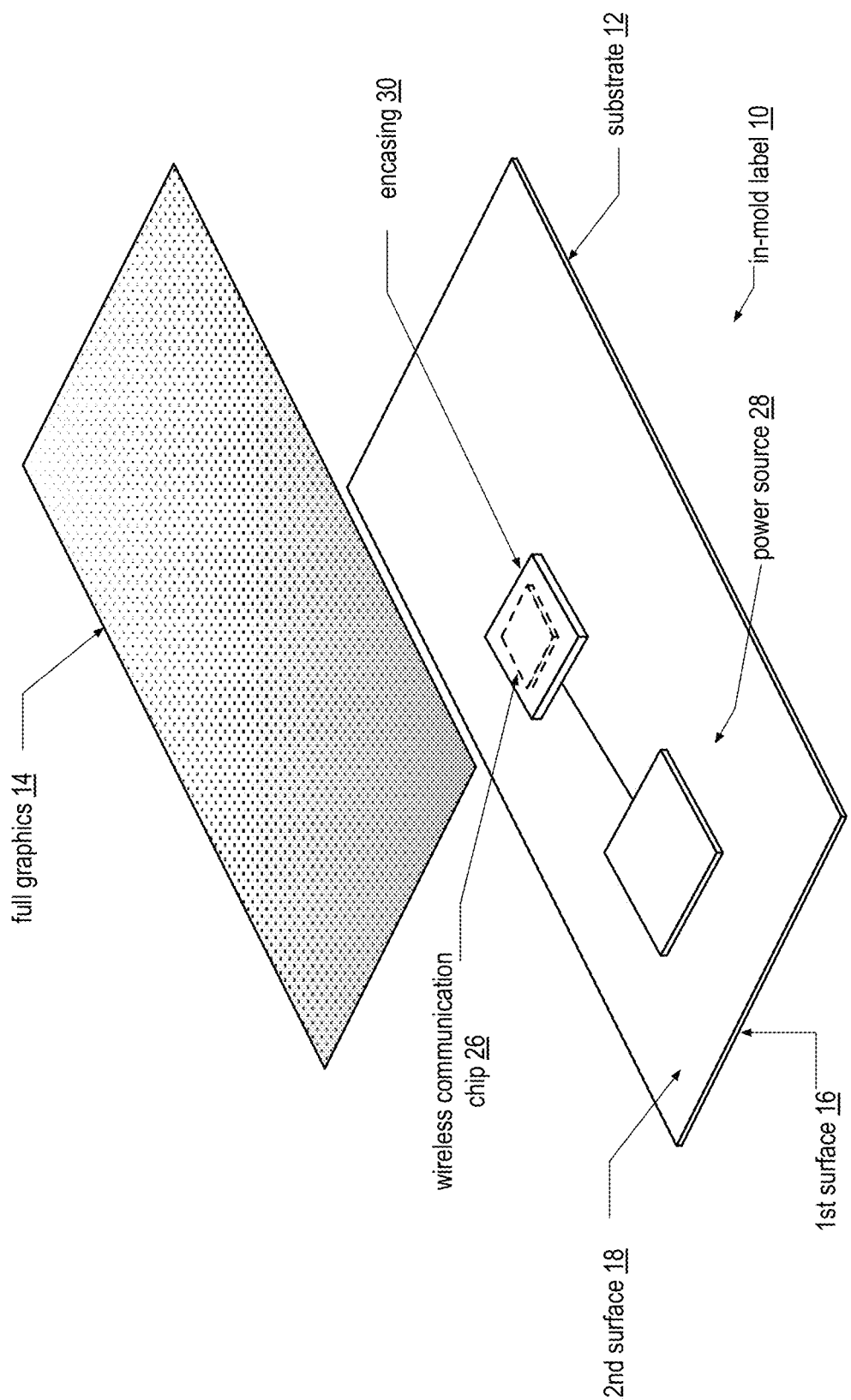
FIG. 9 is an isometric diagram of another embodiment of an in-mold label including a wireless communication chip in accordance with the present invention.

FIG. 9 is an isometric diagram of another embodiment of an in-mold label 10 that includes the substrate 12, the full graphics area 14, the power source 28, and a wireless communication chip 26. In this embodiment, the wireless communication chip 26 is encased in an encasing 30 to reduce the chip's exposure to temperatures during the molding and/or adhering process and/or to improve the chip's adhesion to the finished product and/or to the label 10. The encasing 30 may be of a similar material to that of the substrate 12 and/or of the finished product. The encasing 30 may include an antenna (e.g., an array, transmit-receive antenna pair, diversity antennas, etc.) or NFC coil that couples to the chip 26 for enhancing the range of communication of the chip. Further, the antenna or coil may be embedded or adhered to the second surface 18 and coupled to the chip 26.

Figure 10:
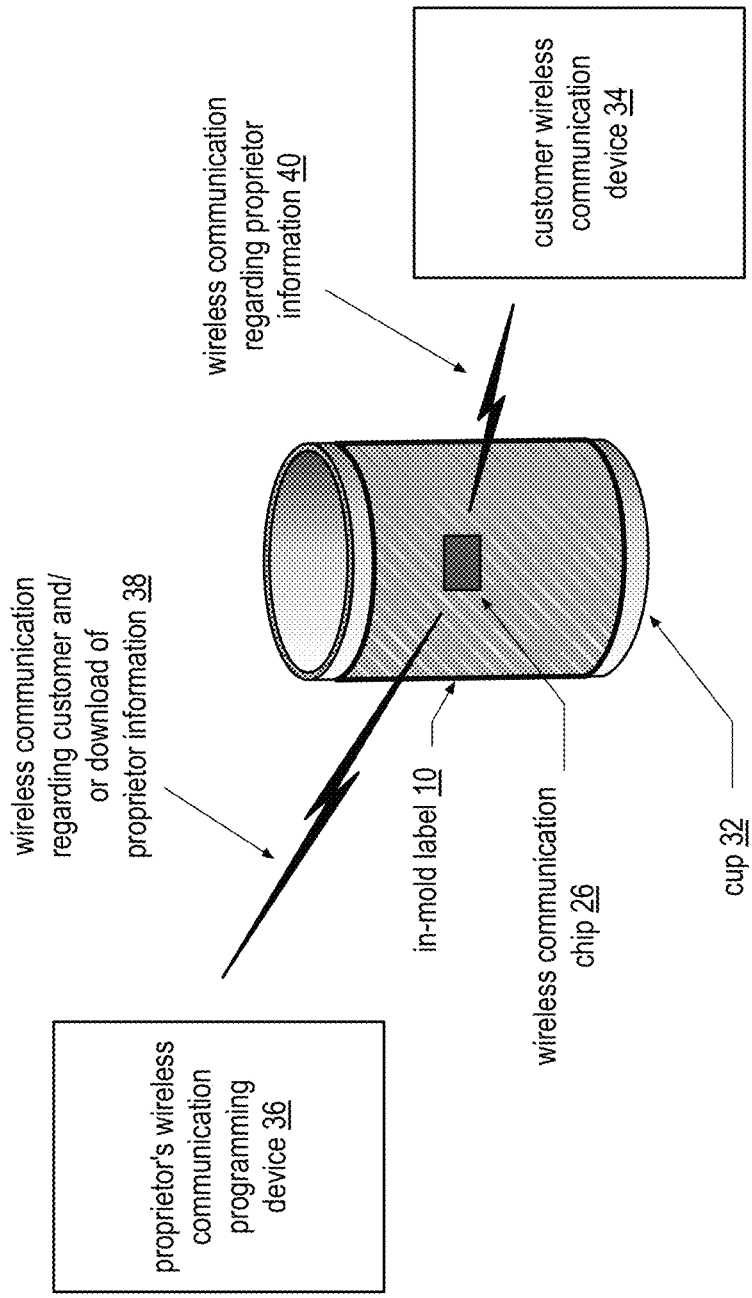
FIG. 10 is an isometric diagram of an example of a cup having an in-mold label that includes a wireless communication chip communicating with a customer's wireless communication device and/or a proprietor's wireless communication programming device in accordance with the present invention.

FIG. 10 is an isometric diagram of an example of a cup 32, or jar, having an in-mold label 10 that includes a wireless communication chip 26 communicating with a customer's wireless communication device 34 and/or with a proprietor's wireless communication programming device 36. The customer's wireless communication device 34 may be a cellular telephone, a tablet computer, a laptop computer, a handheld video game, etc. The proprietor's wireless communication device 36 may be a cellular telephone, a tablet computer, a laptop computer, a personal computer, etc.

In an example of operation, the proprietor's wireless communication device 36 downloads information 40 to the cup. This may be done on a cup-by-cup basis, on a group of cup by group of cup basis, and/or as a broadcast. For example, general coupons, specials, advertisements, etc. are broadcast to the cups at once to update the cups in an efficient manner. As another example, cups 32 may be grouped based on size (e.g., child sized, adult sized, etc.), by typical content (e.g., water, soda, beer, etc.), or other category and information specific to the groups are sent to the group of cups. As yet another example, a cup 32 being used by a particular customer may be individually addressed to provide specific information 38 to the user.

Once a chip 26 has been programmed (e.g., received information from the proprietor's wireless communication device), a customer's wireless communication device 34 can establish communication with the chip 26 using conventional communication set up protocols for the one or more types of wireless communication protocols employed by the chip. When a communication link is established, the customer's wireless communication device 34 can receive the information 40, which may be a URL to the proprietor's web page, or other web page, coupons for the proprietor's establishment(s), a game (promotional, for kids, etc.), an audio file, a video file, a membership invitation, phone numbers, menus, frequent user points, etc. In addition, the information 40 may be advertisements from third parties. In this instance, the proprietor may derive income from for-sale advertisement on the cups.

The customer's wireless communication device 34 may also communicate information to the chip 26 on the cup 32. Such information may vary greatly from personal information, personal preferences, previous orders at this establishment, previous orders from like establishments, etc. When the cup 32 is collected, the customer's information can be downloaded to the proprietor's wireless communication device 36 to update the customer's profile and/or to create one.

The type of wireless communication chip 26 may vary depending on the use of the cup. For example, a cup 32 that is given to the customer may include a simpler chip 26, such as a QR code chip or RFID chip since communication back to the chip 26 with information regarding the customer is not needed. When the cup 32 will be repeatedly used in the proprietor's establishment, a more sophisticated chip (NFC, BT, WLAN) may be used to support two way communications and/or to support general, group, and specific downloading of information.

When the label 10 is included in a jar 32, the wireless communication chip 26 may be downloaded with information regarding the contents of the jar 32. For example, the chip 26 may receive nutritional information, price, expiration date, packaging date, advertisements of other products by manufacturer, etc. Recycling of the jar 32 allows for the chip 26 to be reprogrammed for a different use.

Figure 11:
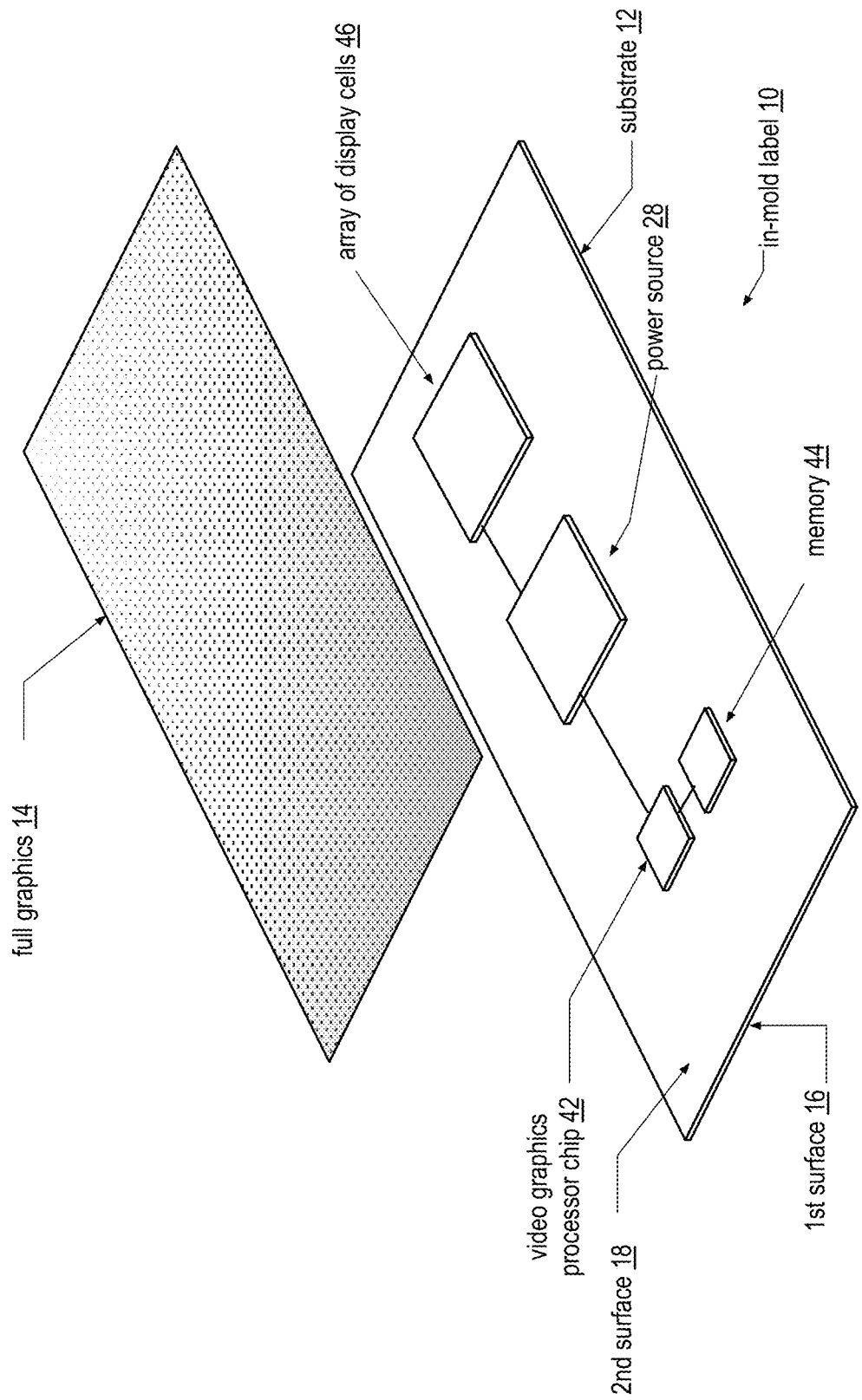
FIG. 11 is an isometric diagram of an embodiment of an in-mold label including a video graphics processor chip, memory, and an array of display cells in accordance with the present invention.

FIG. 11 is an isometric and exploded view diagram of an embodiment of an in-mold label 10 that includes the substrate 12, the power source 28, a video graphics processor chip 42, memory 44, and an array of display cells 46. The array of display cells 46 includes DLP (digital light projection), LCD (liquid crystal display), LED (light emitting diode), and/or other types of display cells. The memory 44 may be read only memory (ROM) and/or random access memory (RAM) and stores one or more video files, one or more picture files, and/or one or more graphics files. The video graphics processor chip 42 includes circuitry to convert a video file stored in the memory 44 into a rendering for display on the array of display cells 46. Note that the substrate 12 may include a section over the array of display cells 46 to provide a screen for the display.

In this embodiment, the video graphics processor chip 42, the memory 44, the power source 28, and the array of display cells 46 are placed on the second surface 18 and under the ink of the graphics area 14. One or more of the chips may be encased as discussed with reference to FIG. 9. Note that the in-mold label 10 may be molded into and/or attached to a final product as discussed above.

Figure 12:
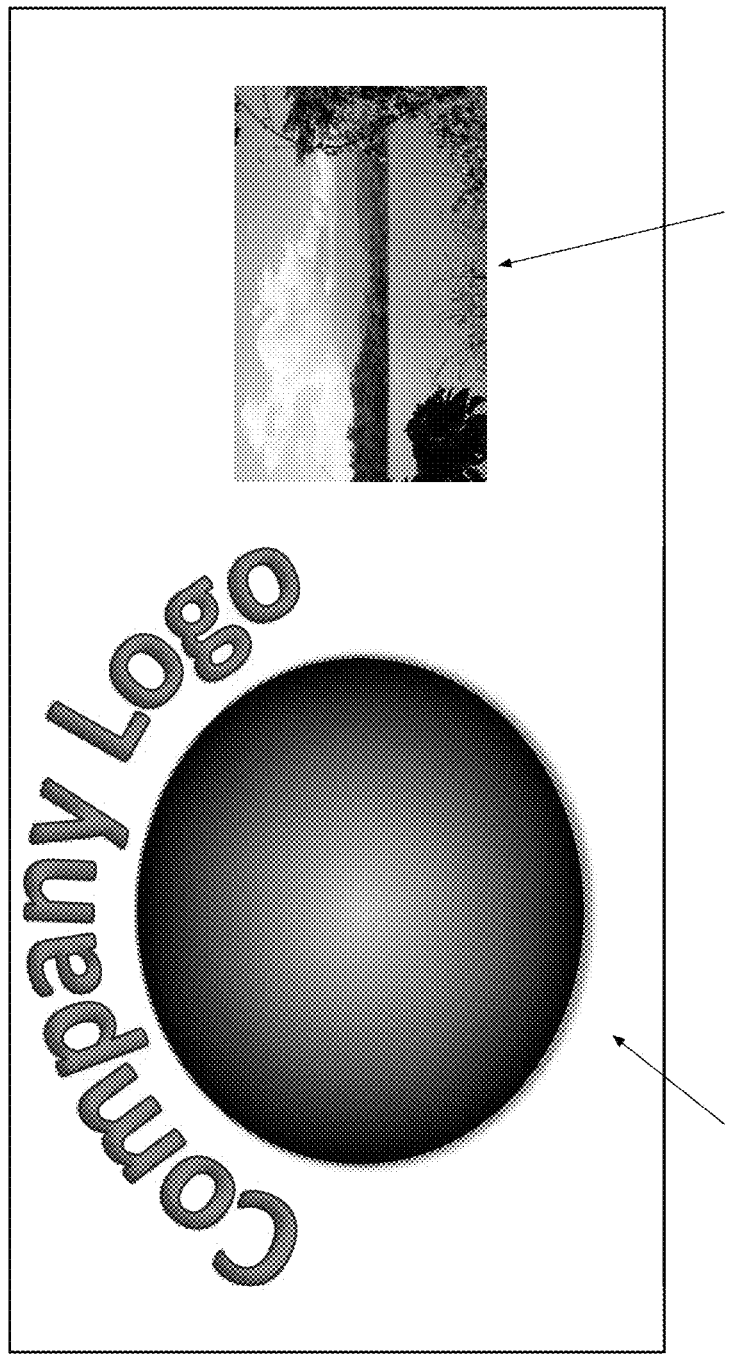
FIG. 12 is a diagram of an example of an in-mold label including a full color graphics section and a video display in accordance with the present invention.

FIG. 12 is a diagram of an example of an in-mold label of FIG. 11 including a full color graphics section 48 and a video display 50. The graphics section 48 includes the company logo and the display area 50 a file retrieved from memory. For example, the display area 50 may display a video file (e.g., a video clip, a new clip, a sports clip, an advertisement, etc.). As another example, the display area 50 may display one or more picture files (e.g., JPEG, TIFF, etc. images of advertisements, today's specials, etc.). As yet another example, the display area 50 may be display one or more graphics files (e.g., text messages, other company logos, advertisements, etc.).

The circuitry of FIG. 11 may be programmed to automatically display one of the stored files, sequentially loop playback of each file (or some of the files), repeat the loop playback of the files, etc. Alternatively, the in-mold label of FIG. 11 may further include a graphical user interface (or the like) to enable the user to select, which, if any, of the files to playback. The graphical user interface may include conventional playback features such as pause, fast-forward, stop, reverse, etc.

Figure 13:
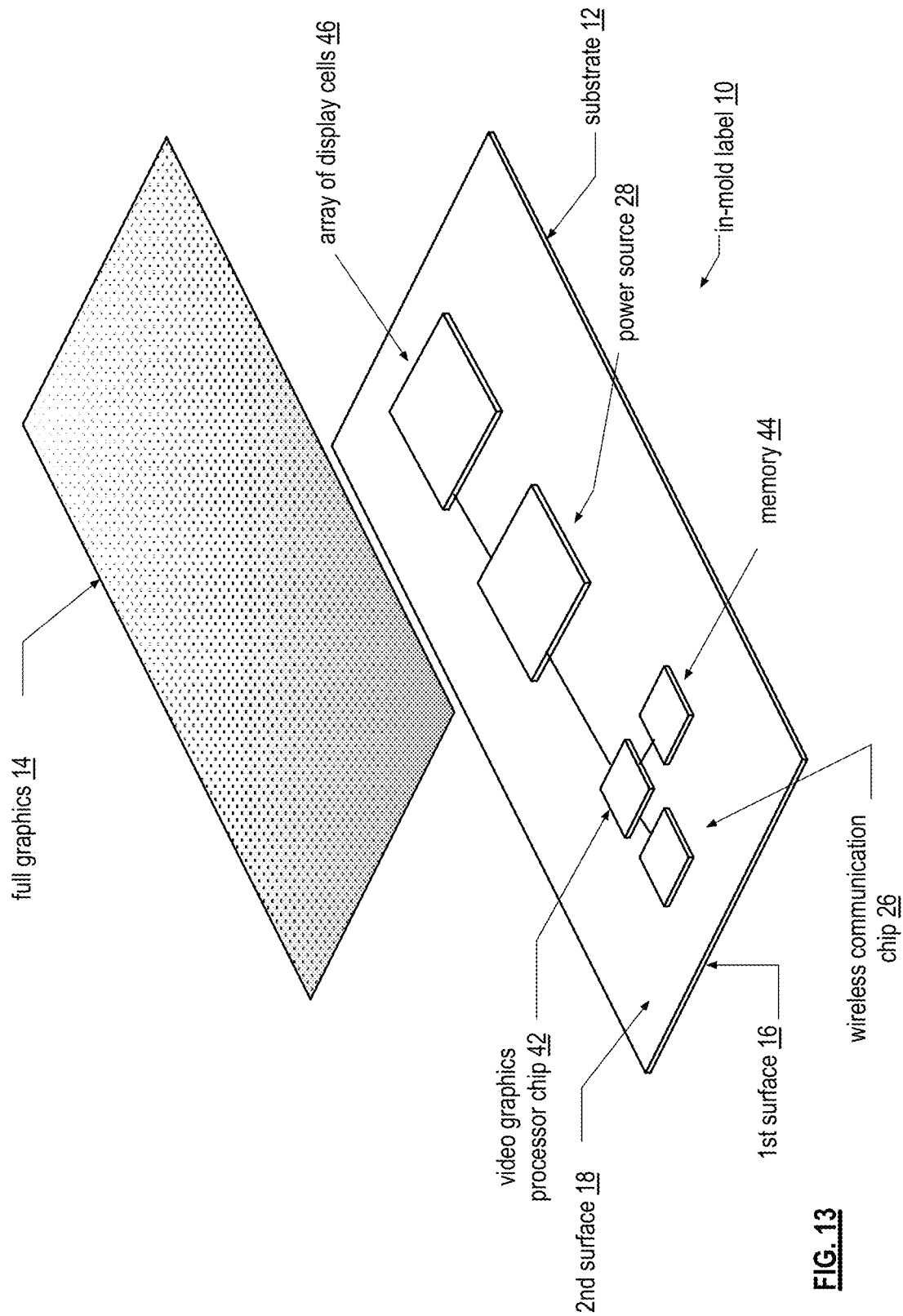
FIG. 13 is an isometric diagram of an embodiment of an in-mold label including a wireless communication chip, a video graphics processor chip, memory, and an array of display cells in accordance with the present invention.

FIG. 13 is an isometric and exploded view diagram of an embodiment of an in-mold label 10 that includes the wireless communication chip 26, the power source 28, the video graphics processor chip 42, the memory 44, and the array of display cells 46. This embodiment combines the features and functionalities of the in-mold label 10 of FIGS. 8-10 with the features and functionalities of the in-mold label 10 FIGS. 11 and 12. In addition, the wireless communication chip 26 may receive new files for storage in the memory 44 and/or coordinate deleting one or more files stored in memory 44.

Figure 14:
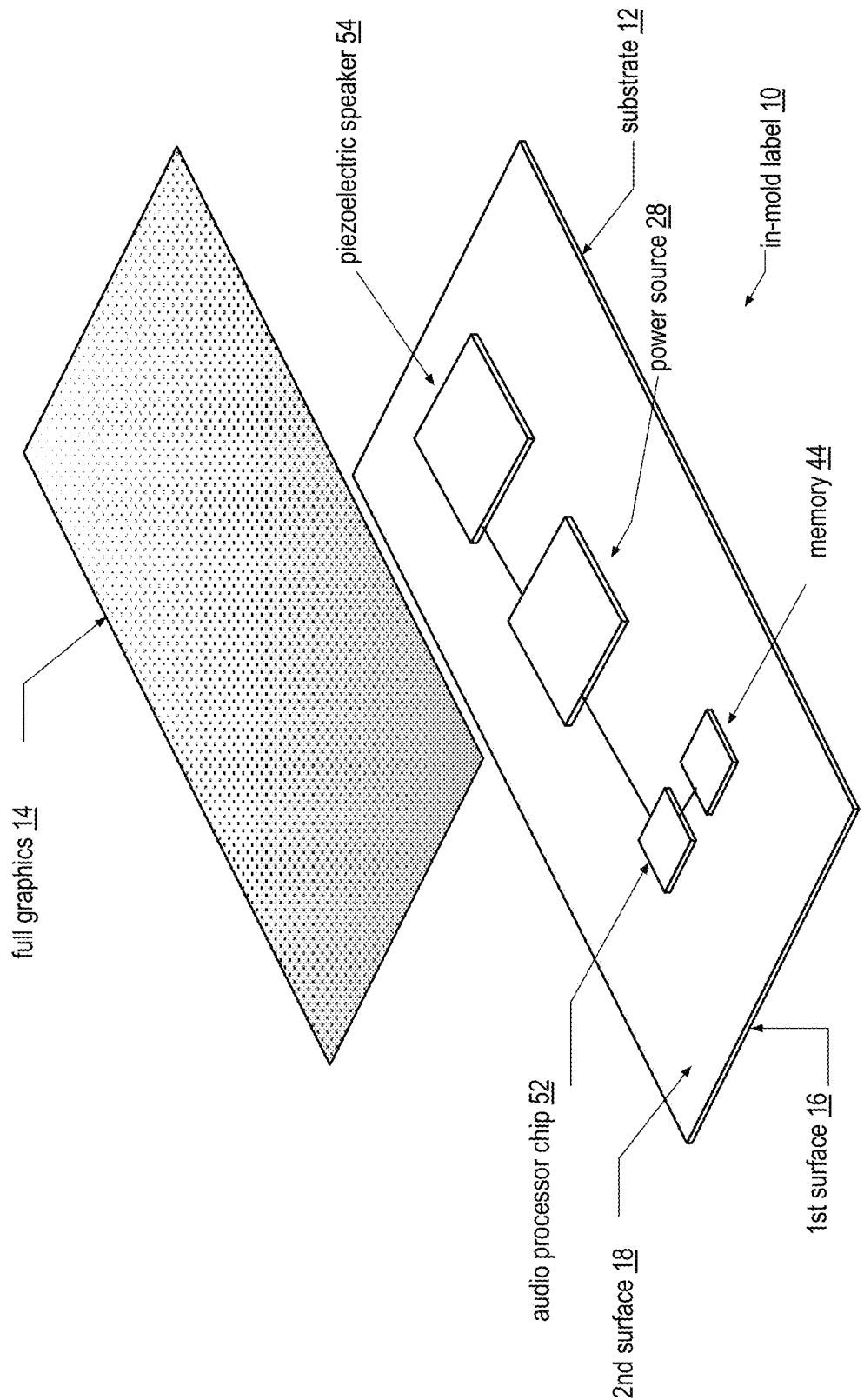
FIG. 14 is an isometric diagram of an embodiment of an in-mold label including an audio processor chip, memory, and a piezoelectric speaker in accordance with the present invention.

FIG. 14 is an isometric diagram of an embodiment of an in-mold label 10 that includes the substrate 12, the power source 28, an audio processor chip 52, memory 44, and one or more piezoelectric speakers 54. The memory 44 may be read only memory (ROM) and/or random access memory (RAM) and stores one or more audio files. The audio processor chip 52 includes circuitry to convert an audio file stored in the memory 44 into signals that are rendered audible by the speaker 54.

In this embodiment, the audio processor chip 52, the memory 44, the power source 28, and the piezoelectric speaker(s) 54 are placed on the second surface 18 and under the ink of the graphics area 14. One or more of the chips may be encased as discussed with reference to FIG. 9. Note that the in-mold label may be molded into and/or attached to a final product as discussed above.

Figure 15:
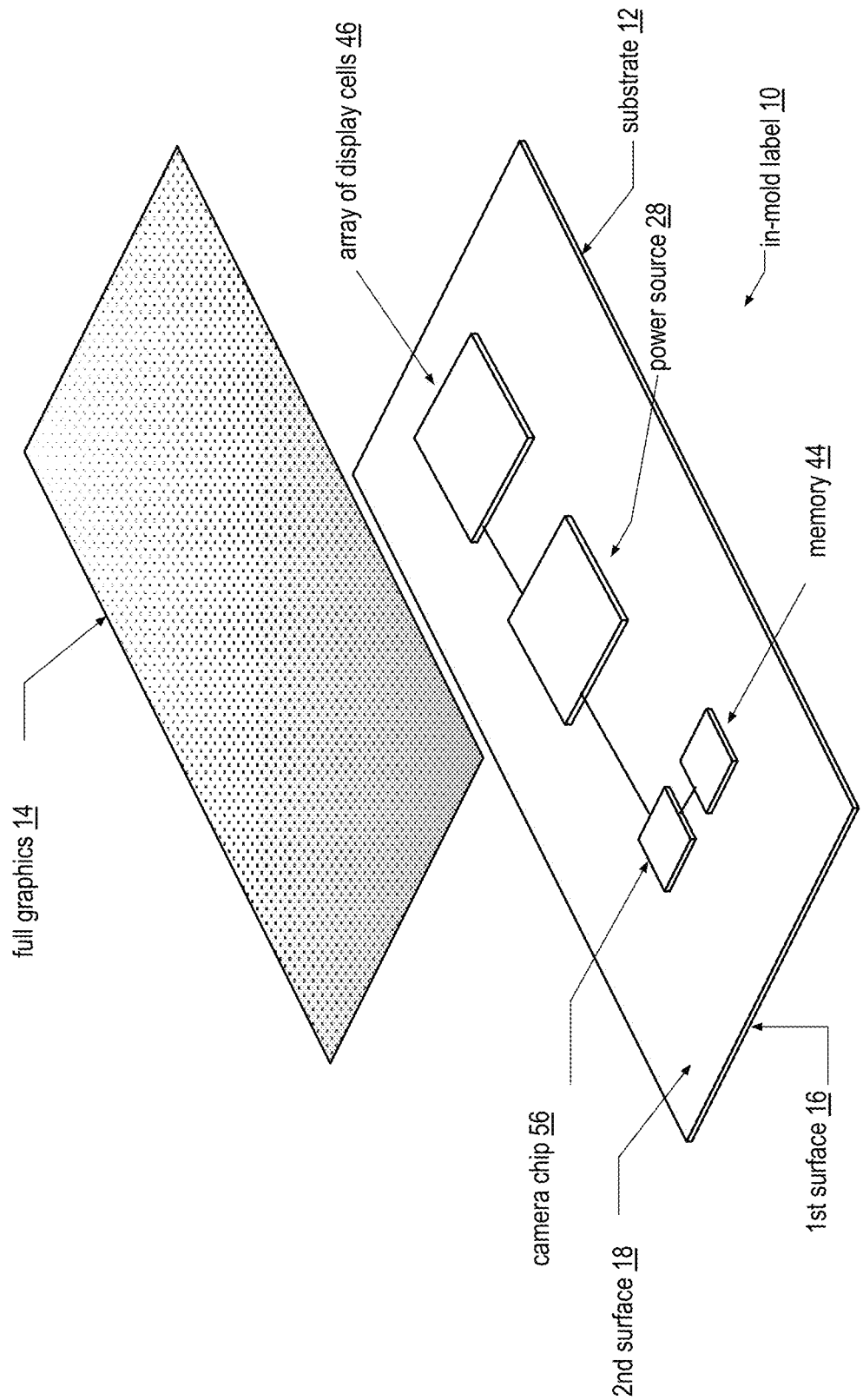
FIG. 15 is an isometric diagram of an embodiment of an in-mold label including a camera chip, memory, and an array of display elements in accordance with the present invention.

FIG. 15 is an isometric diagram of an embodiment of an in-mold label 10 that includes the substrate 12, the power source 28, a camera chip 56, memory 44, and the array of display elements 56. In this embodiment, the camera chip 56 functions to capture images digitally that are stored in the memory 44 and/or displayed on the array of display cells 46. Note that the substrate 12 may include a lens section over the camera chip 56 to improve capturing of images.

In this embodiment, the power source 28, the camera chip 56, the memory 44, and the array of display cells 46 are placed on the second surface 18 and under the ink of the graphics area 14. One or more of the chips may be encased as discussed with reference to FIG. 9. Note that the in-mold label 10 may be molded into and/or attached to a final product as discussed above.

Figure 16:
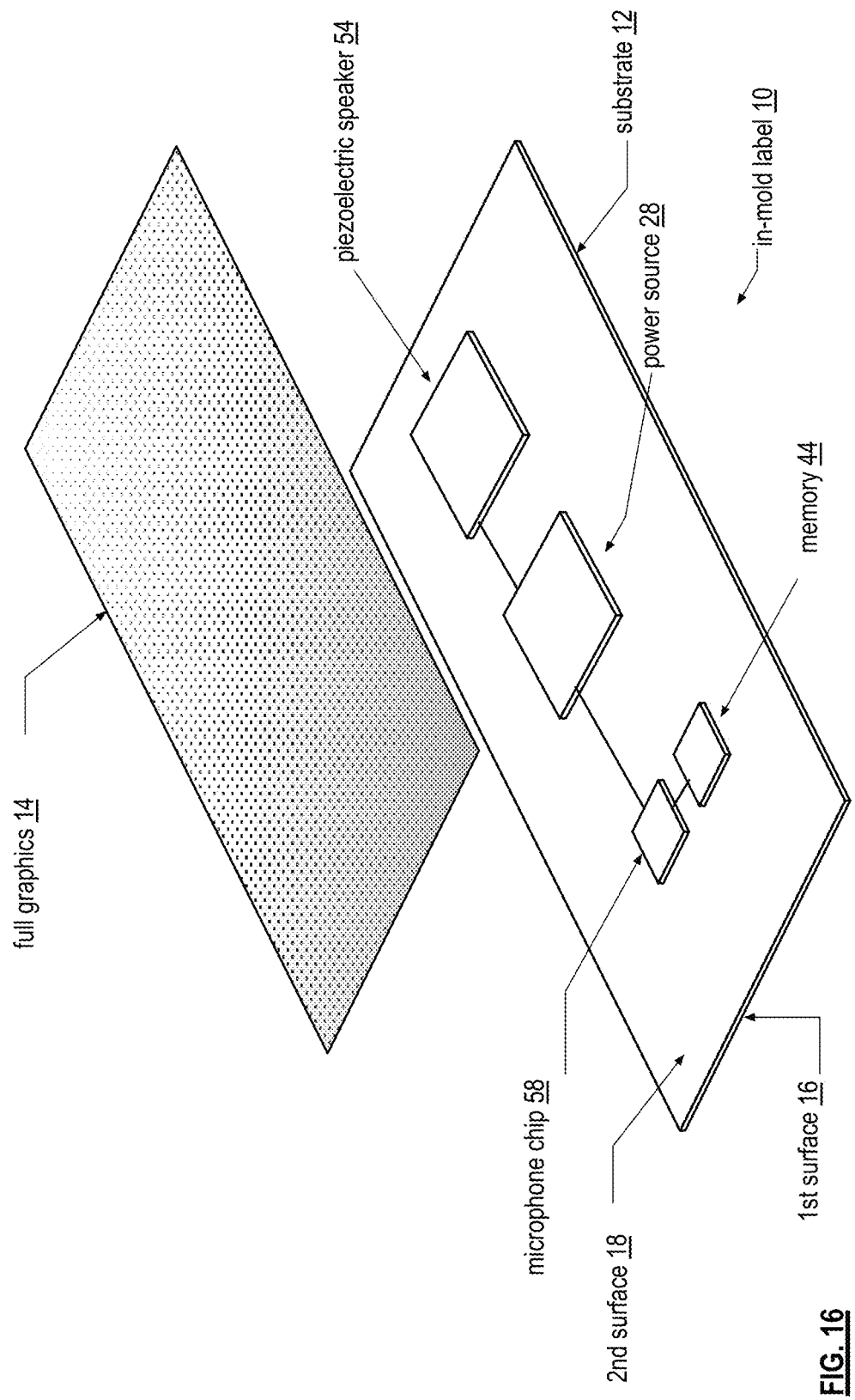
FIG. 16 is an isometric diagram of an embodiment of an in-mold label including a microphone chip, memory, and a piezoelectric speaker in accordance with the present invention.

FIG. 16 is an isometric diagram of an embodiment of an in-mold label 10 that includes the substrate 12, the power source 28, a microphone chip 58 (e.g., a transducer, amplifier, and audio processing circuitry to convent analog signals captured by the transducer into digital signals), memory 44, and one or more piezoelectric speakers 54. In this embodiment, the microphone chip 58 functions to capture sounds digitally that are stored in the memory 44 and/or displayed on the speaker(s).

In this embodiment, the power source 28, the microphone chip 58, the memory 44, and the piezoelectric speakers 54 are placed on the second surface 18 and under the ink of the graphics area 14. One or more of the chips may be encased as discussed with reference to FIG. 9. Note that the in-mold label may be molded into and/or attached to a final product as discussed above.

In the preceding discussion, the in-mold labels was molded into and/or adhered to a plastic product. In another embodiment, an in-mold label may be fabricated as a plastic mailer, which may have a punch out section. In this instance, the label would be laminated on each side to protect the label. Note that the substrate may be paper, a post card, or plastic. Further note that the mailer label product may be a magazine insert.

The plastic label mailer could include a wireless chip that is programmed to include the address of the addressee and other information relevant to the sender of the plastic mailer. For example, the other information may be advertisements, coupons, sales information, purchase history of the address, available credits to the addressee, etc. The punch out section may include the chip or another chip that includes redeemable information for the addresses.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. An in-mold label consisting of:
a single-layer substrate having a first surface on one side of the substrate and a second surface on an opposite side of the substrate, wherein, when the in-mold label is molded on to, or into, a plastic product that is composed of styrene acrylonitrile (SANS), the first surface faces outward with respect to the plastic product to make contact with a molding tool and the second surface faces inward with respect to the plastic product, wherein the single-layer substrate is composed of one or more of styrene, SANS, and a styrene mix; and
a full graphics area located on the second surface where ink is applied to produce a full color or single color graphics image, wherein the full graphics area is covered with a heat activated adhesive to support bonding the single layer substrate with the plastic product, wherein when the second surface is subjected to material used to produce the plastic product and the first surface is subjected to the molding tool, the full color or single color graphics image from the ink is molded onto the plastic product along with the substrate, in which the substrate, the adhesive, and the ink have at least one complementary property to a property of the plastic product, wherein the complementary property includes a molding temperature range, wherein the ink, substrate, and adhesive being within the molding temperature range during the molding, cause the in-mold label to sufficiently bond to the plastic product, and wherein the single layer substrate is non-opaque such that the full color or single color graphics image is readily visible from the first surface side.

2. The in-mold label of claim 1, wherein the molding temperature range is 300 to 600 degrees Fahrenheit.

3. The in-mold label of claim 1, wherein the in-mold label is one of a plurality of in-mold labels formed as a sheet or as a roll.

4. The in-mold label of claim 1, wherein the ink is applied in the area by one or more of:
the ink is silk-screened in the area;
the ink is applied by offset lithography in the area;
the ink is flexographicly applied in the area;
the ink is gravure applied in the area;
the ink is digitally printed in the area;
the ink is applied by heat transfer in the area; and
the ink is web offset using ultraviolet (UV) light applied in the area.

5. The in-mold label of claim 1, wherein the complementary property further includes one or more of:
a chemical composition;
a flexibility; and
a durability.

6. The in-mold label of claim 1, wherein the ink is at least one of:
a thermochromatic ink;
full color ink; and
single color ink.

7. The in-mold label of claim 1 further consists of a second area on the first surface, wherein the ink is further applied in the second area to provide a duplicate printing of the image on the plastic product.

8. The in-mold label of claim 1 further consists of a second area on the first surface, wherein the ink is further applied in the second area to provide at least one of a three-dimensional effect and a holographic image.

9. The in-mold label of claim 1, wherein the substrate is a styrene material such that the in-mold label is substantially static free when stacked and holds a static charge on the first surface for securing by a molding tool.

10. A finished plastic product consisting of:
a plastic form that is composed of styrene acrylonitrile (SANS);
an in-mold label that includes a single-layer substrate having a first surface on one side of the substrate and a second surface on an opposite side of the substrate, wherein, when the in-mold label is molded on to, or into, the plastic form, the first surface faces outward with respect to the plastic form to make contact with a molding tool and the second surface faces inward with respect to the plastic form, wherein the single-layer substrate is composed of one or more of styrene, SANS, and a styrene mix; and
a full graphics area located on the second surface where ink is applied to produce a full color or single color graphics image, wherein the full graphics area is covered with a heat activated adhesive to support bonding the single layer substrate with the plastic form, wherein when the second surface is subjected to material used to produce the plastic form and the first surface is subjected to the molding tool, the full color or single color graphics image from the ink is molded onto the plastic form along with the substrate, in which the substrate, the adhesive, and the ink have complementary property to a property of the plastic form, wherein the complementary property includes a molding temperature range, wherein the ink, substrate, and adhesive being within the molding temperature range during the molding, cause the in-mold label to sufficiently bond to the plastic form, and wherein the single layer substrate is non-opaque such that the full color or single color graphics image is readily visible from the first surface side.

11. The finished plastic product of claim 10, wherein the finished plastic product is one of:
a cup, a jar, a plate, a tray, a novelty item, an office supply, a cell phone cover, a place mate, a mailer, or a magazine insert.

12. The finished plastic product of claim 10, wherein the in-mold label is molded on to the plastic form to produce the finished plastic product having the image as a label on the finished plastic product.

13. The finished plastic product of claim 10, wherein the in-mold label and the plastic form are molded together to produce the finished plastic product having the image as a label on the finished plastic product.

14. The finished plastic product of claim 10 further comprising a three-dimensional shape that includes one of:
a cube;
a pyramid;
a cone; and
a polyhedron.

* * * * *